(12) United States Patent
Yoshinaga et al.

(10) Patent No.: US 11,621,541 B2
(45) Date of Patent: Apr. 4, 2023

(54) QUANTUM CASCADE LASER

(71) Applicant: SUMITOMO ELECTRIC INDUSTRIES, LTD., Osaka (JP)

(72) Inventors: Hiroyuki Yoshinaga, Osaka (JP); Jun-ichi Hashimoto, Osaka (JP); Masato Furukawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 226 days.

(21) Appl. No.: 17/086,640

(22) Filed: Nov. 2, 2020

(65) Prior Publication Data
US 2021/0135432 A1 May 6, 2021

(30) Foreign Application Priority Data
Nov. 5, 2019 (JP) .............................. JP2019-200633

(51) Int. Cl.
  H01S 5/34 (2006.01)
  H01S 5/026 (2006.01)
  H01S 5/028 (2006.01)
  H01S 5/30 (2006.01)

(52) U.S. Cl.
  CPC ............ H01S 5/3401 (2013.01); H01S 5/026 (2013.01); H01S 5/0267 (2013.01); H01S 5/0286 (2013.01); H01S 5/309 (2013.01)

(58) Field of Classification Search
  CPC ..... H01S 5/0267; H01S 5/0286; H01S 5/3401
  See application file for complete search history.

(56) References Cited

U.S. PATENT DOCUMENTS

| 2002/0102756 A1* | 8/2002 | Borchert | ................ H01S 5/026 438/16 |
| 2017/0012408 A1* | 1/2017 | Hashimoto | ............. H01S 5/125 |
| 2018/0166858 A1* | 6/2018 | Hashimoto | ........... H01S 5/0287 |

OTHER PUBLICATIONS

Wang, Qi Jie, et al., "High performance quantum cascade lasers based on three-phonon-resonance design," Applied Physics Letters, vol. 94, 011103 (2009), p. 011103-1-p. 011103-3.

* cited by examiner

*Primary Examiner* — Michael Carter
(74) *Attorney, Agent, or Firm* — Volpe Koenig

(57) ABSTRACT

A quantum cascade laser includes a laser structure having an output face for emitting laser light in a first direction; and a lens having an entrance surface and a convex surface, the entrance surface receiving the laser light from the output face, and the convex surface emitting the laser light after being condensed by the lens. The laser structure includes a semiconductor substrate and a mesa waveguide provided on a first region of a principal surface of the semiconductor substrate, the mesa waveguide extending in the first direction. The lens includes a semiconductor and is provided on a second region of the principal surface of the semiconductor substrate. The first region and the second region are arranged in the first direction.

8 Claims, 14 Drawing Sheets

QUANTUM CASCADE LASER

CROSS REFERENCE TO RELATED APPLICATIONS

The present application is based upon and claims the benefit of the priority from Japanese patent application No. 2019-200633, filed on Nov. 5, 2019, which is hereby incorporated by reference in its entirety.

TECHNICAL FIELD

The present disclosure relates to a quantum cascade laser.

BACKGROUND

Qi Jie Wang et al., "High performance quantum cascade lasers based on three-phonon-resonance design", APPLIED PHYSICS LETTERS, vol. 94, 011103, 2009 discloses a quantum cascade laser.

SUMMARY

The present disclosure provides a quantum cascade laser including a laser structure having an output face for emitting laser light in a first direction, and a lens having an entrance surface and a convex surface, the entrance surface receiving the laser light from the output face, and the convex surface emitting the laser light after being condensed by the lens. The laser structure includes a semiconductor substrate, and a mesa waveguide provided on a first region of a principal surface of the semiconductor substrate, the mesa waveguide extending in the first direction. The lens includes a semiconductor and is provided on a second region of the principal surface of the semiconductor substrate. The first region and the second region are arranged in the first direction.

BRIEF DESCRIPTION OF THE DRAWINGS

The foregoing and other purposes, aspects and advantages will be better understood from the following detailed description of a preferred embodiment of the invention with reference to the drawings.

DETAILED DESCRIPTION

Figure 1:
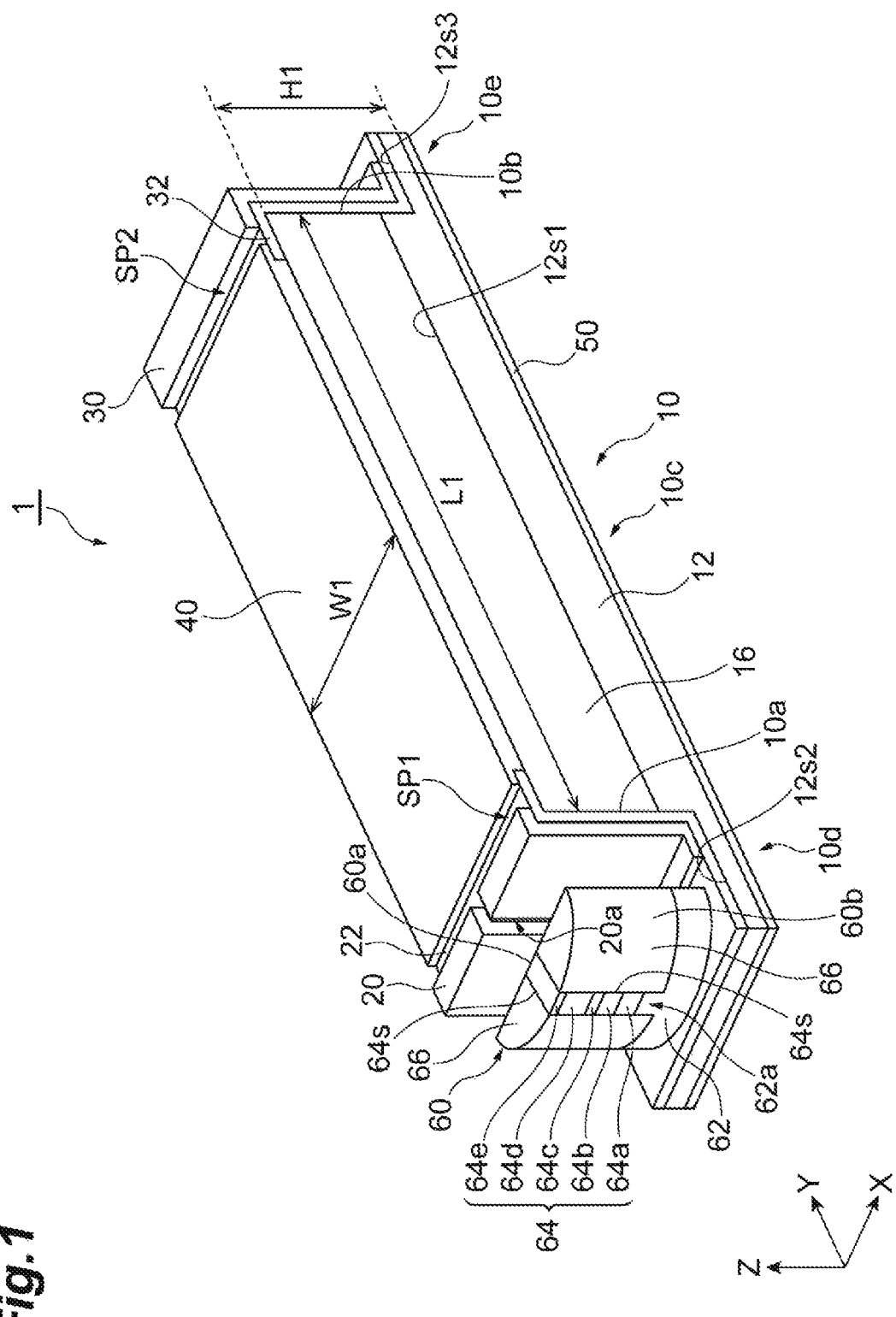
FIG. 1 is a perspective view schematically showing a quantum cascade laser according to an embodiment.

Problem to be Solved by the Present Disclosure

Laser light emitted from an output face of a quantum cascade laser has a certain spread angle, and the laser light may diverge. Optical coupling efficiency between the quantum cascade laser and a light-receiving device which is subjected to the laser light may then be reduced.

The present disclosure provides a quantum cascade laser capable of suppressing diverging of emitted laser light.

DESCRIPTION OF EMBODIMENTS OF THE PRESENT DISCLOSURE

A quantum cascade laser according to an embodiment includes a laser structure having an output face for emitting laser light in a first direction; and a lens having an entrance surface and a convex surface, the entrance surface receiving the laser light from the output face, and the convex surface emitting the laser light after being condensed by the lens. The laser structure includes a semiconductor substrate and a mesa waveguide provided on a first region of a principal surface of the semiconductor substrate, the mesa waveguide extending in the first direction. The lens includes a semiconductor and is provided on a second region of the principal surface of the semiconductor substrate. The first region and the second region are arranged in the first direction.

According to the quantum cascade laser, laser light emitted from the output face of the laser structure is incident on the entrance surface of the lens, the laser light condensed emitted from the convex surface of the lens is condensed by the lens. As a result, even if laser light emitted from the output face of the laser structure diverges, the laser light can be condensed by the lens. Therefore, the laser light emitted from the quantum cascade laser can be prevented from diverging. Both the mesa waveguide and the lens are provided on the principal surface of the semiconductor substrate. Thus, the mesa waveguide and the lens can be formed together on the principal surface of the semiconductor substrate by, for example, photolithography and etching. Therefore, the lens can be positioned with high accuracy with respect to the mesa waveguide.

The lens may be a plano-convex lens, and the convex surface may be convexly curved when viewed from a second direction intersecting the principal surface of the semiconductor substrate. According to the lens, the laser light diverging in a plane along the principal surface of the the semiconductor substrate can be condensed.

The quantum cascade laser may further include a reflecting film provided on the output face, and the reflecting film may have a slit transmitting the laser light. According to the quantum cascade laser, the slit may have an effect on the laser light to diverge. By combining the lens and the slit, the laser light spread by the slit can be condensed by the lens.

The laser structure may further include a current blocking region embedding a side surface of the mesa waveguide. The current blocking region may include an undoped or semi-insulating semiconductor. The lens may include a semiconductor mesa extending in the first direction and a semiconductor embedding region embedding a side surface of the semiconductor mesa. The semiconductor embedding region may include an undoped or semi-insulating semiconductor. According to the quantum cascade laser, the mesa waveguide and the semiconductor mesa can be formed together, and the current blocking region and the semiconductor embedding region can be formed together, for example, by photolithography and etching. Therefore, the semiconductor mesa can be positioned with high accuracy with respect to the mesa waveguide, and the semiconductor embedding region can be positioned with high accuracy for the current blocking region on the semiconductor substrate.

Hereinafter, embodiments of the present disclosure will be described in detail with reference to the accompanying drawings. In the description of the drawings, the same reference numerals are used for the same or equivalent elements, and a repetitive description is omitted.

Figure 2:
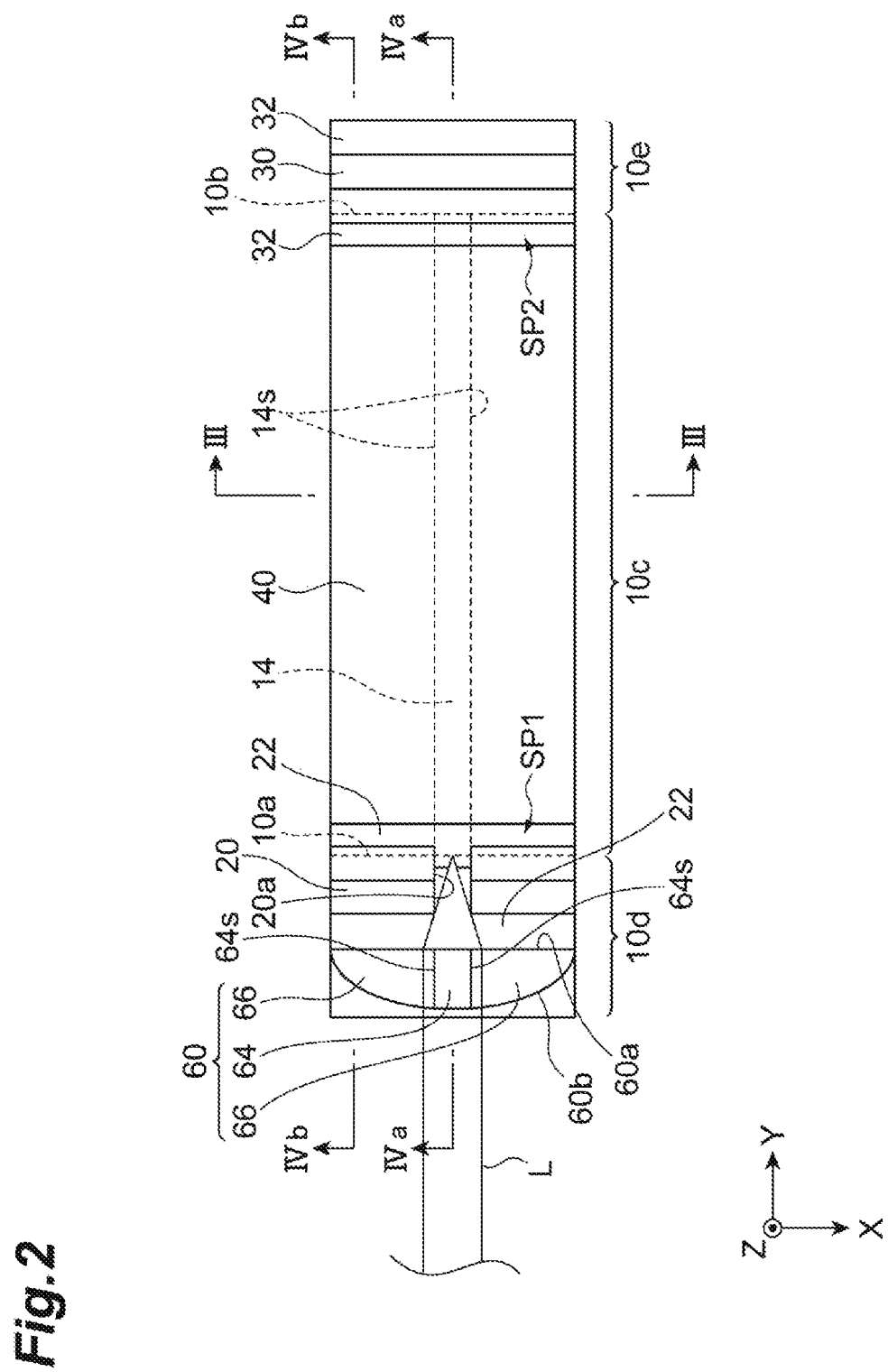
FIG. 2 is a top view schematically showing a quantum cascade laser according to an embodiment.
Figure 3:
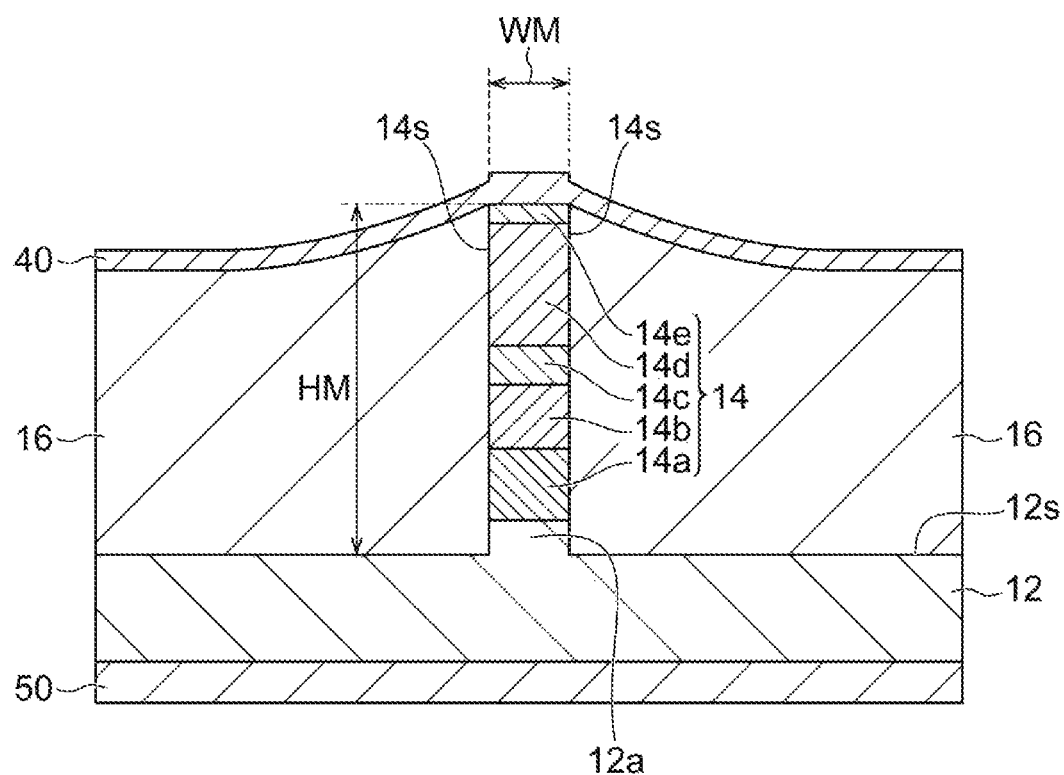
FIG. 3 is a cross-sectional view taken along of FIG. 2.
Figure 4A:
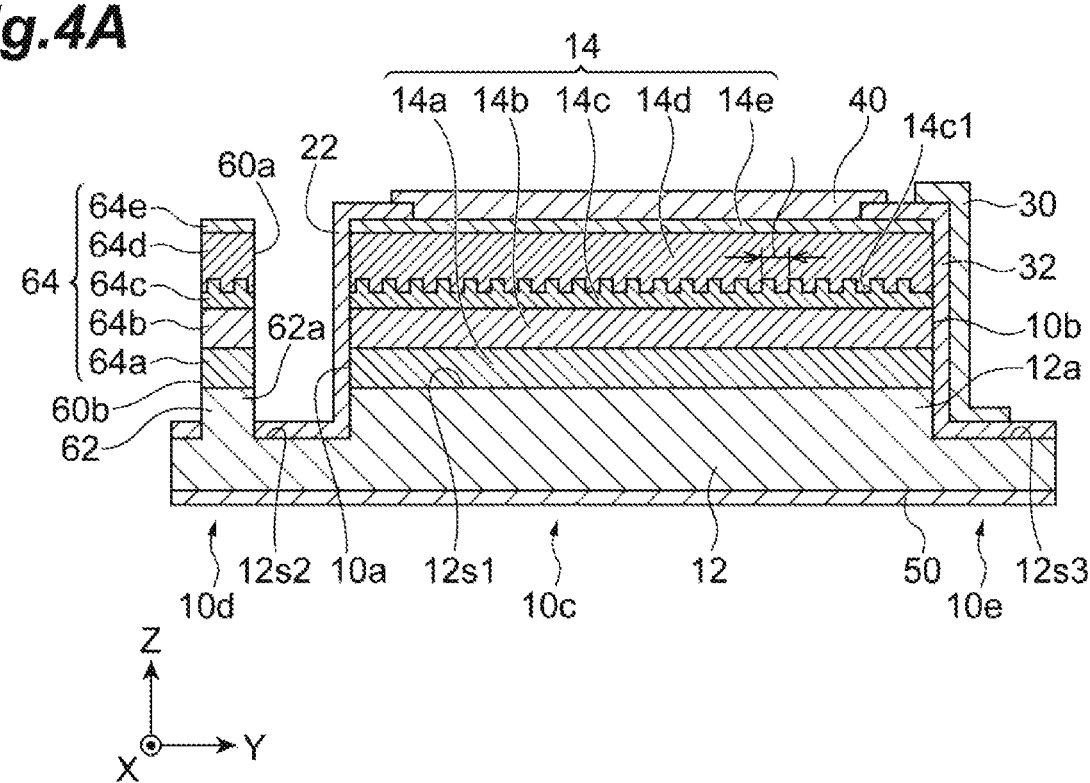
FIG. 4A is a cross-sectional view taken along IVa-IVa of FIG. 2.
Figure 4B:
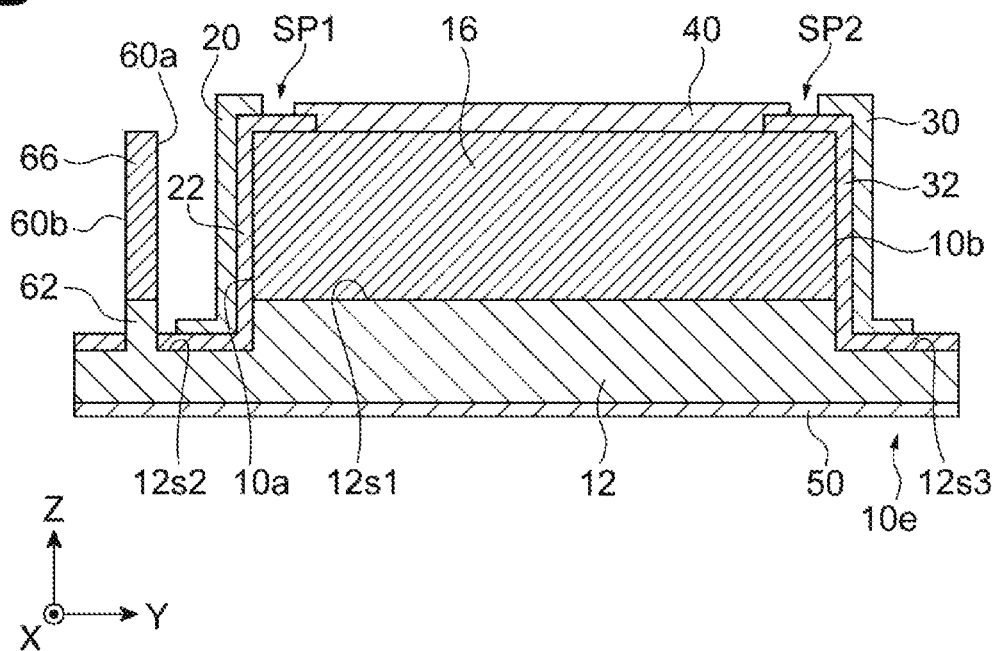
FIG. 4B is a cross-sectional view taken along IVb-IVb of FIG. 2.
Figure 5:
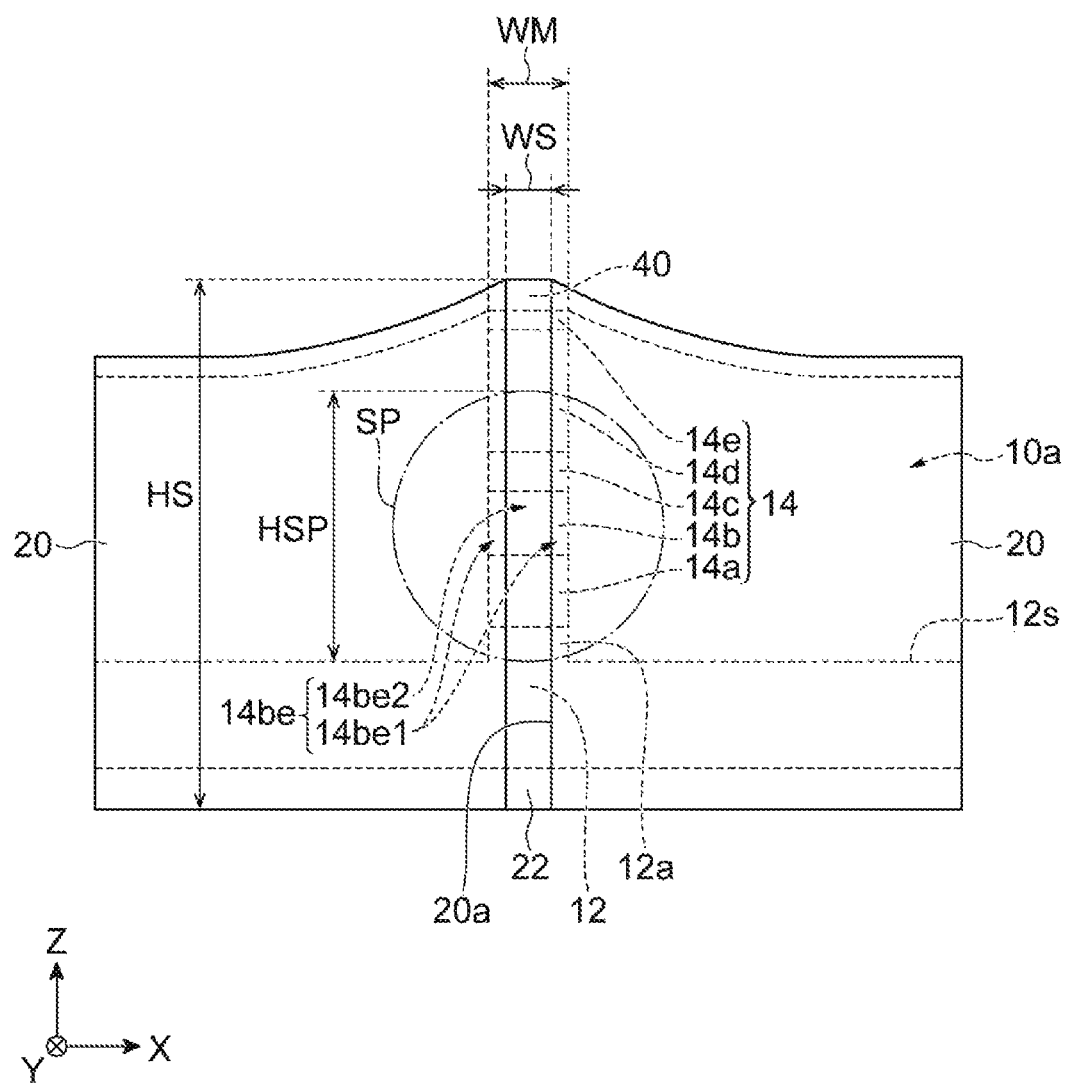
FIG. 5 is a front view schematically showing an output face of a quantum cascade laser according to an embodiment.

FIG. 1 is a perspective view schematically showing a quantum cascade laser according to an embodiment. FIG. 2 is a top view schematically showing a quantum cascade laser according to an embodiment. FIG. 3 is a cross-sectional view taken along line of FIG. 2. FIG. 4A a cross-sectional view taken along IVa-IVa line of FIG. 2. FIG. 4B is a cross-sectional view taken along IVb-IVb line of FIG. 2. FIG. 5 is a front view schematically showing an output face of the quantum cascade laser according to the embodiment. In FIG. 1 to FIG. 5, X-axis direction, Y-axis direction (first direction), and Z-axis direction (second direction) those are intersecting each other are shown. X-axis direction, Y-axis direction, and Z-axis direction are perpendicular to each other, for example.

A quantum cascade laser 1 shown in FIG. 1 to FIG. 5 is used, for example, in an industrial laser-processing apparatus, or in an optical measurement apparatus for environmental analysis, industrial gas analysis, medical diagnosis, and the like. The quantum cascade laser 1 includes a laser structure 10 and a lens 60. The laser structure 10 is a resonator capable of oscillating laser light L in the Y-axis direction. The laser structure 10 has an output face 10a for emitting the laser light L in the Y-axis direction, and has a reflection face 10b opposed to the output face 10a in the Y-axis direction. The output face 10a is a front end face. The reflection face 10b is a rear end face. Each of the output face 10a and the reflection face 10b may be perpendicular to the Y-axis direction. Each of the output face 10a and the reflection face 10b has, for example, a rectangular shape.

The laser structure 10 includes a main body 10c having the output face 10a and the reflection face 10b, a first protruding portion 10d protruding in the Y-axis direction from a lower end of the output face 10a, and a second protruding portion 10e protruding in the Y-axis direction from a lower end of the reflection face 10b. In the Y-axis direction, the main body 10c is disposed between the first protruding portion 10d and the second protruding portion 10e. The main body 10c is, for example, a rectangular parallelepiped. Each of the first protruding portion 10d and the second protruding portion 10e is a plate shape extending in the X-axis direction and the Y-axis direction. The main body 10c of the laser structure 10 has a length L1 of, for example, 1 to 3 mm in the Y-axis direction, a width W1 of, for example, 400 to 800 μm in the X-axis direction, and a thickness H1 of, for example, 100 to 200 μm in the Z-axis direction.

The laser structure 10 includes a semiconductor substrate 12. A principal surface 12s of the semiconductor substrate 12 extends in the X-axis direction and the Y-axis direction. The principal surface 12s of the semiconductor substrate 12 includes a first region 12s1, a second region 12s2, and a third region 12s3. The first region 12s1, the second region 12s2, and the third region 12s3 are arranged in the Y-axis direction. The first region 12s1 is disposed between the second region 12s2 and the third region 12s3.

The laser structure 10 includes a mesa waveguide 14 provided on the first region 12s1 of the principal surface 12s of the semiconductor substrate 12, and a current blocking region 16 embedding a side surface 14s of the mesa waveguide 14. The mesa waveguide 14 extends along the Y-axis. In the X-axis direction, the mesa waveguide 14 is disposed between a pair of the current blocking regions 16. In this case, the laser structure 10 has an buried heterostructure (BH) structure. The current blocking region 16 may include a semiconductor having undoped or semi-insulating nature such as Fe-doped InP, for example. The semiconductor is, for example, a group III-V compound semiconductor. A portion of the semiconductor substrate 12 located under the first region 12s1, the mesa waveguide 14, and current blocking region 16 constitute the main body 10c. A portion of the semiconductor substrate 12 under the second region 12s2 constitutes the first protruding portion 10d. A portion of the semiconductor substrate 12 under the third region 12s3 constitutes the second protrusion 10e.

The semiconductor substrate 12 is, for example, an n-type group III-V compound semiconductor substrate such as n-type InP substrate. The semiconductor substrate 12 has a protruding part 12a extending in the Y-axis direction. The mesa waveguide 14 is provided on the protruding part 12a.

The Mesa waveguide 14 extends in the Y-axis direction and protrudes in the Z-axis direction. The Y-axis direction is a direction of the mesa waveguide 14 extends along. The mesa waveguide 14 has a height HM from the principal surface 12s. The height HM of the mesa waveguide 14 is, for example, 10 μm. The mesa waveguide 14 is a laminate including a plurality of semiconductor layers laminated in the Z-axis direction. The mesa waveguide 14 includes a lower cladding layer 14a provided on the protruding part 12a of the semi-conductor substrate 12, a core layer 14b provided on the lower cladding layer 14a, a grating layer 14c provided on the core layer 14b, a upper cladding layer 14d provided on the grating layer 14c, and a contact layer 14e provided on the upper cladding layer 14d. In the Z-axis direction, the protruding part 12a, the lower cladding layer 14a, the core layer 14b, the grating layer 14c, the upper cladding layer 14d. and the contact layer 14e are arranged in this order.

An upper electrode 40 is provided on the contact layer 14e and on the current blocking region 16. A lower electrode 50 is provided on a back surface of the substrate 12. The back surface is facing away from the principal surface 12s. When the quantum cascade laser 1 operates, one of the upper electrode 40 and the lower electrode 50 serves as a cathode electrode and the other serves as an anode electrode. Current is injected into the core layer 14b by a predetermined voltage applied between the upper electrode 40 and the lower electrode 50. As a result, laser light L is oscillated. The upper electrode 40 and the lower electrode 50 are, for example, Ti/Au film, Ti/Pt/Au film, Ge/Au film, or the like.

The lower cladding layer 14a and the upper cladding layer 14d are n-type group III-V compound semiconducting layers such as n-type InP layers, for example. InP is transparent to mid-infrared radiation.

The core layer 14b has a structure in which a plurality of active layers and a plurality of injection layers are alternately laminated. Each of the active layer and the injection layer has a superlattice row in which a plurality of well layers and a plurality of barrier layers are alternately laminated. Each of the well layer and the barrier layer has a thickness of several nanometers. As the superlattice row, GaInAs/AlInAs or the like can be adopted. Only electrons are used as carriers. Intersubband transitions produce laser light L in the mid-infrared region (e.g., wavelength of 7 µm) to be oscillated.

The grating layer 14c has a plurality of recess 14c1 periodically arranged at pitches A along the Y-axis direction. The pitch A defines the oscillation wavelength λ of the laser light L. Each recess 14c1 is a groove extending in the X-axis direction. As a result, the quantum cascade laser 1 functions as a distributed feedback (DFB) laser. The recess 14c1 of the grating layer 14c is embedded by the upper cladding layer 14d. The grating layer 14c is a group III-V compound semiconducting layer such as an undoped or n-type GaInAs layer.

The contact layer 14e is, for example, an n-type group III-V compound semiconducting layer such as an n-type GaInAs layer.

An optical confinement layer may be provided between the lower cladding layer 14a and the core layer 14b. An optical confinement layer may be provided between the grating layer 14c and the core layer 14b. The optical confinement layer is, for example, an n-type group III-V compound semiconducting layer such as an undoped or n-type GaInAs layer.

As the n-type dopant, for example, Si, S, Sn, Se or the like can be used.

The quantum cascade laser 1 includes a reflecting film 20 and a reflecting film 30. The reflecting film 20 is provided on the output face 10a via a passivation film 22. The passivation film 22 covers, for example, the entire surface of the output face 10a. A first end of the passivation film 22 in the Y-axis direction may extend in the Y-axis direction on an upper surface of the main body 10c of the laser structure 10. The first end of the passivation film 22 may reach the upper electrode 40. A second end of the passivation film 22 in the Y-axis direction may extend in the Y-axis direction on an upper surface of the first protruding portion 10d of the laser structure 10. A first end of the reflecting film 20 in the Y-axis direction may extend in the Y-axis direction on the first end of passivation film 22. A space SP1 is formed between the first end of reflecting film 20 and the upper electrode 40. The space SP1 electrically separates the upper electrode 40 and the reflecting film 20. The space SP1 avoids electrical shorting between the upper electrode 40 and the reflecting film 20 when high voltages are applied to the upper electrode 40, e.g., 10 volts or more. A second end of the reflecting film 20 in the Y-axis direction may extend in the Y-axis direction on the upper surface of the first protruding portion 10d of the laser structure 10.

The reflecting film 30 is provided on the reflection face 10b via a passivation film 32. The passivation film 32 and the reflecting film 30 cover, for example, the entire surface of the reflection face 10b. A first end of the passivation film 32 in the Y-axis direction may extend in the Y-axis direction on the upper surface of the main body 10c of the laser structure 10. The first end of passivation film 32 may reach the upper electrode 40. A second end of the passivation film 32 in the Y-axis direction may extend in the Y-axis direction on an upper surface of the second protruding portion 10e of the laser structure 10. A first end of the reflecting film 30 in the Y-axis direction may extend in the Y-axis direction on the first end of passivation film 32. A space SP2 is formed between the first end of reflecting film 30 and the upper electrode 40. The space SP2 electrically separates the upper electrode 40 and the reflecting film 30. The space SP2 avoids electrical shorting between the upper electrode 40 and the reflecting film 30 when high voltages are applied to the upper electrode 40, e.g., 10 volts or more. A second end of the reflecting film 30 in the Y-axis direction may extend in the Y-axis direction on the upper surface of the second protruding portion 10e of the laser structure 10.

The passivation film 22 and the passivation film 32 are, for example, insulating films such as alumina films, $SiO_2$ films, SiON films, or SiN films.

The reflecting film 20 and the reflecting film 30 include, for example, gold. Each of the reflecting film 20 and the reflecting film 30 is, for example, Ti/Au film, Ti/Pt/Au film, or Ge/Au film. Each thickness of the reflecting film 20 and the reflecting film 30 may be 10 nm or more, or may be 50 nm or more, or may be 100 nm or more. The thickness of the reflecting film 30 may be 200 nm or less. When the thickness is 50 nm or more, the reproducibility of the manufacture of the reflecting film is good. The thicker the reflecting film is, the higher the reflectivity can be. However, as reflecting film becomes thicker than 200 nm the increment in the reflectivity becomes smaller. The reflectivity of the reflecting film 20 and the reflecting film 30 for light having a wavelength of 7 µm may be 80% or more, or may be 90% or more. The higher the reflectivity is, the lower threshold current (the current required for lasing) is.

As shown in FIG. 5, the output face 10a includes an end face of the semiconductor substrate 12 in the main body 10c, an end face of the mesa waveguide 14, and end faces of the current blocking regions 16. More specifically, the output face 10a includes an end face 14be of the core layer 14b. The end face 14be includes a first region 14be1 and a second region 14be2 that differs from the first region 14be1. The reflecting film 20 covers the first region 14be1 but does not cover the second region 14be2. That is, the reflecting film 20 partially covers the end face 14be of the core layer 14b. In the present embodiment, the second region 14be2 is disposed between the pair of the first regions 14be1 in the X-axis direction.

The reflecting film 20 has a slit 20a to transmit the laser light L. The slit 20a is provided on the second region 14be2. The slit 20a extends along the Z-axis direction. A width WS of the slit 20a is smaller than a width WM of the mesa waveguide 14. The reflecting film 20 then covers part of the end face of the semiconductor substrate 12, part of the end face of the mesa waveguide 14 and the end faces of the current blocking regions 16. In the present embodiment, the passivation film 22 is provided on the output face 10a in the slit 20a. As a result, it is possible to suppress degradation of semiconducting crystals of the output face 10a due to, for example, oxidation. The passivation film 22 may also have a slit corresponding to the slit 20a. In the slit 20a, a part of the end face of the substrate 12 and a part of the end face of the mesa waveguide 14 are exposed to air. Thus, since the heat dissipation in the output face 10a is improved, it is possible to improve the thermal properties of the quantum cascade laser 1. The width WS of the slit 20a is in a range from 1 μm to 5 μm. The width WM of the mesa waveguide 14 is, for example, in a range from 2 μm to 5 μm. The mesa waveguide 14 with the width WM greater than or equal to 2 μm can have a smaller threshold current. The mesa waveguide 14 with the width WM of 5 μm or less is suitable for single transverse-mode oscillations. In the Z-axis direction, a length HS of the slit 20a is greater than a diameter HSP of a spot size SP of the laser light L in the output face 10a.

In an area of the output face 10a covered with the reflecting film 20, such as the first region 14be1, the reflectivity for light having a wavelength of 7 μm is, for example, 90% or more. On the other hand, in an area of the output face 10a that is not covered with the reflecting film 20, such as the second region 14be2, the reflectivity with respect to the light having the wavelength of 7 μm is, for example, 30% or less. An effective reflectivity of the output face 10a for the light having the wavelength of 7 μm is, for example, 20 to 80%. The slit 20a having the width WS of 1 μm to 5 μm provide the effective reflectivity in this range.

The effective reflectivity $R_{\mathit{eff}}$ (%) of the output face 10a with respect to the oscillation wavelength is expressed by the following equation (1).

$$R_{\mathit{eff}} = 100 - \Gamma \times (1 - R/100) \quad (1)$$

Γ represents the percentage (%) of the light intensity distributed in the area (inside the slit 20a) of the output face 10a that is not covered by the reflecting film 20. Γ is calculated by the beam-propagation method (BPM). R represents the reflectivity (%) of the output face 10a with respect to the oscillating wavelength when the reflecting film 20 is not provided. For example, if Γ is 46% and R is 24%, $R_{\mathit{eff}}$ is 65%.

The lens 60 has an entrance surface 60a for receiving the laser light L from the output face 10a, and a convex surface 60b for emitting the laser light L after being condensed by the lens. The lens 60 includes a semiconductor and are provided on the second region 12s2 of the principal surface 12s of the semiconductor substrate 12. Although a space is provided between the entrance surface 60a of the lens 60 and the output face 10a, the space may be omitted. A distance between the entrance surface 60a and the output face 10a may be, for example, 5 μm or more. In this case, the slit 20a can be formed with high accuracy. The lens 60 is, for example, a plano-convex lens. The plano-convex lens has a semi-cylindrical shape. The entrance surface 60a is perpendicular to the Y-axis direction. The convex surface 60b is convexly curved when viewed from the Z-axis direction intersecting with the principal surface 12s of the semiconductor substrate 12.

The lens 60 includes a semiconductor mesa 64 provided on the second region 12s2 and extending in the Y-axis direction, and a semiconductor embedding region 66 embedding side surfaces 64s of the semiconductor mesa 64. In the X-axis direction, the semiconductor mesa 64 is disposed between a pair of the semiconductor embedding regions 66. The semiconductor mesa 64 and the semiconductor embedding region 66 are provided on a pedestal 62 located in the second region 12s2. The pedestal 62 constitutes a part of the lens 60. The pedestal 62 includes, for example, a semiconductor same as the semiconductor substrate 12. In the present embodiment, the pedestal 62 is integrated with the semiconductor substrate 12. The pedestal 62 has a protruding part 62a. The semiconductor mesa 64 is provided on the protruding part 62a. The semiconductor embedding region 66 includes, for example, an undoped or semi-insulating semiconductor same as the current blocking region 16. Viewed from the Y-axis direction, the semiconductor mesa 64 overlaps the mesa waveguide 14, the semiconductor embedding region 66 overlaps the current blocking region 16, and the protruding part 62a of the pedestal 62 overlaps the protruding part 12a of the semiconductor substrate 12.

The semiconductor mesa 64 includes semiconductor layers 64a, 64b, 64c, 64d, and 64e that are sequentially provided on the protruding part 62a of the pedestal 62. The semiconductor layers 64a to 64e may include semiconductors same as the lower cladding layer 14a, the core layer 14b, the grating layer 14c, the upper cladding layer 14d, and the contact layer 14e, respectively. When viewed from the Y-axis direction, the semiconductor layers 64a to 64e overlap with the lower cladding layer 14a, the core layer 14b, the grating layer 14c, the upper cladding layer 14d, and the contact layer 14e, respectively.

According to the quantum cascade laser 1 of the present embodiment, as shown in FIG. 2, the laser light L emitted from the output face 10a of the laser structure 10 enters the entrance surface 60a of the lens 60, and the condensed laser light L is emitted from the convex surface 60b of the lens 60. As a result, even if the laser light L emitted from the output face 10a of the laser structure 10 diverges, the laser light L can be condensed by the lens 60. Therefore, the laser light L emitted from the quantum cascade laser 1 can be prevented from diverging. Both the mesa waveguide 14 and the lens 60 are provided on the principal surface 12s of the semiconductor substrate 12. Thus, the mesa waveguide 14 and the lens 60 can be formed together on the principal surface 12s of the semiconductor substrate 12 by, for example, photolithography and etching. Therefore, the lens 60 can be positioned with high accuracy with respect to the mesa waveguide 14. In particular, an optical axis of the mesa waveguide 14 and an optical axis of the lens 60 can substantially coincide, within manufacturing variations.

When the convex surface 60b of the lens 60 is curved convexly viewed from the Z-axis direction intersecting the principal surface 12s of the semiconductor substrate 12, it is possible to condense laser light L spread in the plane along the principal surface 12s of the semiconductor substrate 12 (e.g., X-Y plane).

When the reflecting film 20 provided on the output face 10a has the slit 20a that allows laser light L to pass therethrough, the laser light L is easily diverged by the slit 20a. Even in such a case, the laser light L can be condensed by the lens 60. For example, if the slit 20a extends along the Z-axis direction, the laser light L is more likely to diverge due to the slit 20a in a plane along the principal surface 12s of the semiconductor substrate 12, e.g., in the X-Y plane. Even in such cases, the diverged laser light L can be condensed by the lens 60.

Also, in the first region 14be1 of the end face 14be of the core layer 14b, most of laser light L is reflected by the reflecting film 20. On the other hand, in the second region 14be2 of the end face 14be of the core layer 14b, most of the laser light L is emitted from the output face 10a. Therefore, by adjusting a ratio of an area of the first region 14be1 to an area of the second region 14be2, the effective reflectivity $R_{\mathit{eff}}$ of laser light L in the output face 10a can be controlled. As the first region 14be1 becomes smaller relative to the second region 14be2, the effective reflectivity of laser light L in the output face 10a decreases. Conversely, as the first region 14be1 becomes larger relative to the second region 14be2, the effective reflectivity of laser light L in the output face 10a increases. The effective reflectivity is adjustable, for example, in the range of 20% to 80% for light with a wavelength of 7 μm. Therefore, it is unnecessary to control the thickness of the reflecting film 20 with high accuracy. Further, optical output power of laser light L may be, for example, 10 mW or more.

When the lens 60 includes the semiconductor mesa 64 and the semiconductor embedding region 66, the mesa waveguide 14 and the semiconductor mesa 64 can be formed together, e.g., by photolithography and etching. The current blocking region 16 and the semiconductor embedding region 66 can be formed together. Therefore, the semiconductor mesa 64 can be positioned with high accuracy with respect to the mesa waveguide 14, and the semiconductor embedding regions 66 can be positioned with high accuracy with respect to the current blocking regions 16. In particular, the optical axis of mesa waveguide 14 and the optical axis of the lenses 60 can substantially coincide, within manufacturing variations.

Figure 6A:
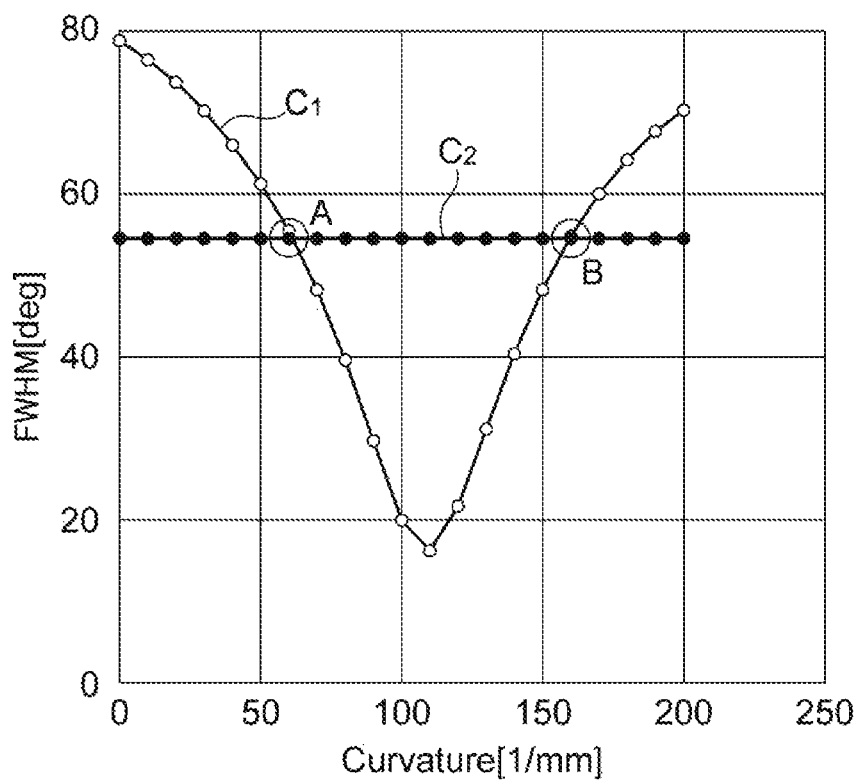
FIG. 6A is a graph showing an example of a relationship between curvature of a plano-convex lens and half-width of far-field pattern of laser light condensed by the plano-convex lens.
Figure 6B:
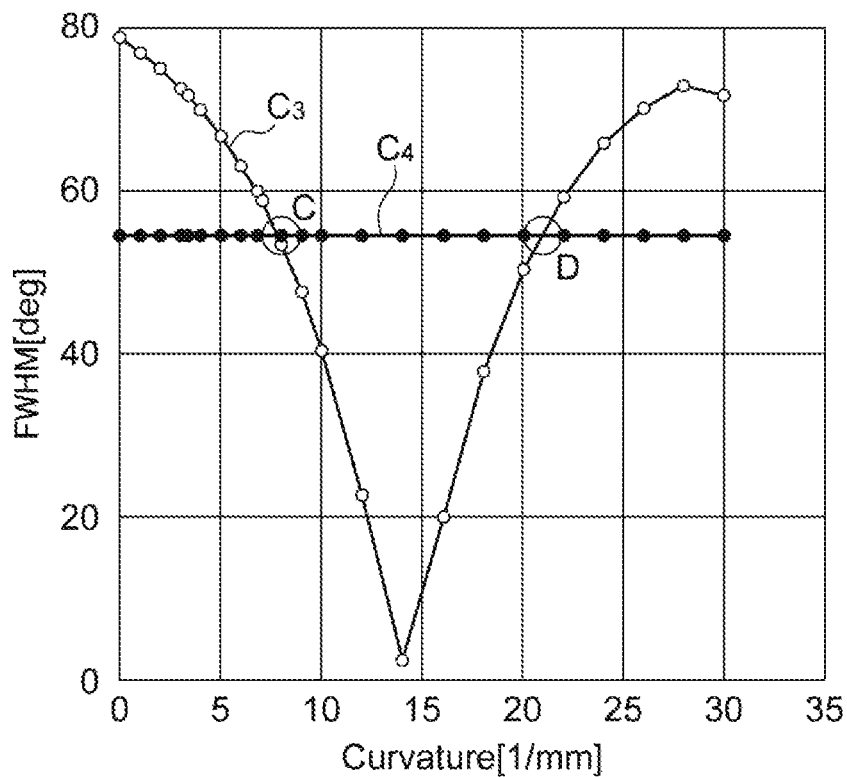
FIG. 6B is a graph showing an example of a relationship between curvature of a plano-convex lens and half-width of far-field pattern of laser light condensed by the plano-convex lens.

Hereinafter, with referring to FIG. 6A and FIG. 6B, simulations for a quantum cascade laser having the same configuration as that of quantum cascade laser 1 will be described as an exemplary embodiment. In the simulations, a width of a slit of a reflecting film provided on an output face is set to 2 μm, a distance between the entrance surface 60a of the lens 60 and the output face 10a is set to 1 μm, and wavelength of laser light is set to 7.365 μm. First, in a first quantum cascade laser, a thickness (length in the Y-axis direction) of the plano-convex lens is fixed to 10 μm. While changing a curvature of the plano-convex lens in the X-Y plane, the far field patterns of laser light condensed by the plano-convex lens are calculated. Next, in a second quantum cascade laser, the thickness (length in the Y-axis direction) of the plano-convex lens is fixed to 100 μm. While changing the curvature of the plano-convex lens in the X-Y plane, the far-field patterns of the laser light condensed by the plano-convex lens are calculated. FIG. 6A shows the simulation results for the first quantum cascade laser. FIG. 6B shows the simulation results for the second quantum cascade laser. The horizontal axis indicates the curvature of the plano-convex lens in the X-Y plane (unit: 1/mm). The vertical axis indicates the full-width at half maximum (FWHM) (unit: degrees) in the far-field pattern (FFP) of laser light condensed by the plano-convex lens.

In FIG. 6A, the solid line $C_1$ indicates FWHM in the X-axis direction. The solid line $C_2$ indicates FWHM in the Z-axis direction. In the solid line $C_1$, FWHM decreases as the curvature increases from 0. After the curvature reaches a local minimum value in the vicinity of 110 [1/mm], FWHM increases as the curvature increases. This is due to a light condensing effect in the X-axis direction of the plano-convex lens in the X-Y plane. On the other hand, in the solid line $C_2$, since the curvature in the Z-axis direction is 0, FWHM does not change even if the curvature changes.

In FIG. 6B, the solid line $C_3$ denotes FWHM in the X-axis direction. The solid line $C_4$ indicates FWHM in the Z-axis direction. In the solid line $C_3$, since the plano-convex lens has a light condensing effect in the X-axis direction in the X-Y plane, FWHM decreases as the curvature increases from 0, and after the curvature reaches a local minimum value in the vicinity of 14 [1/mm], FWHM increases as the curvature increases. On the other hand, in the solid line $C_4$, since the curvature in the Z-axis direction is 0, FWHM does not change even if the curvature changes.

In FIG. 6A, the solid line $C_1$ and the solid line $C_2$ intersect at the points shown as A and B. In FIG. 6B, the solid line $C_3$ and the solid line $C_4$ intersect at the points shown as C and D. Therefore, FWHM in the X-axis direction and FWHM in the Z-axis direction coincides with each other at the points A, B, C, and D. That is, at the points shown as A, B, C and D, a beam cross-sectional shape of the converged laser light becomes substantially circular. When a laser light having a substantially circular beam cross-sectional shape is emitted, an optical coupling efficiency between the quantum cascade laser and an external optical element (e.g., optical fiber or spherical lens) is improved.

As described above, there are usually two points where FWHM in the Z-axis direction and FWHM in the X-axis direction coincides. In general, the smaller the curvature, the easier it is to manufacture the lens. Thus, the lens of the curvature is selected at the point A in FIG. 6A, and is selected at the point C in FIG. 6B. When the point indicated by A is selected, the length of the plano-convex lens in the X-axis direction is 30.6 μm. When the point indicated by C is selected, the length of the plano-convex lens in the X-axis direction is 245 μm. Since the length of the quantum cascade laser in the X-axis direction is usually 300 μm to 400 μm, a plano-convex lens having the above dimensions can be formed. By adjusting the distance in the Y-axis direction between the output face of the laser structure and the entrance surface of the plano-convex lens, the thickness of the plano-convex lens in the Y-axis direction (length in the Y-axis direction), and the curvature in the X-axis direction of the plano-convex lens, it is possible to obtain a laser light having a substantially circular beam cross-sectional shape.

In addition, in FIG. 6A and FIG. 6B, the local minimum value of FWHM in the X-axis direction is as small as 20 degrees or less. Therefore, laser light emitted from the plano-convex lens does not diverge in the X-axis direction. Therefore, a laser light close to collimated light can be obtained.

Next, referring to FIG. 7 to FIG. 10, simulations for a quantum cascade layer having a configuration similar to that of the quantum cascade laser 1 will be described. However, the quantum cascade laser for the simulation is a Fabry-Perot (FP)-type quantum cascade laser having no grating layer. This quantum cascade laser has a mesa waveguide in which an n-type InP lower cladding layer, a core layer, a n-GaInAs upper optical confinement layer, a n-InP upper cladding layer, and a n-GaInAs contact layer are formed in this order on an n-type InP substrate. The core layer has a configuration in which unit-structures each composed of an active layer and an injection layer including GaInAs/AlInAs superlattice rows are laminated. The mesa waveguide has a width WM. Sides of the mesa waveguide are embedded by Fe—InP current blocking region. A Au upper electrode is provided on n-GaInAs contact layer. A Au lower electrode is provided on the back surface of the n-type InP substrate. On the entire surface of the rear end face of the laser structure, an Au high reflecting film (reflectivity is almost 100%) is provided via an aluminum insulating film. On the entire surface of the front end face (output face) of the laser structure, an Au high-reflecting film (reflectivity is almost 100%) having a slit is provided via an aluminum film. The slit is provided at a position corresponding to the mesa waveguide. The slit has a width WS. The oscillation wavelength of laser light is 7.365 μm. Since the absorption of alumina with respect to this wavelength is negligibly small, the calculation was carried out by approximating the absorption by alumina to zero. The thickness of the Au high-reflecting film is set to be sufficiently thick (e.g., 100 nm to 200 nm) to obtain total reflectance.

The reflectivity of the laser light at the output face depends not only on the Au high-reflecting film but also on the thickness of the alumina film. The thickness of the alumina film is expressed by using $\lambda$ ($=\lambda_0/n$) as a unit. The "$\lambda_0$" represents the oscillation wavelength (i.e., 7.365 μm) in vacuo. "n" represents the refractive index of alumina (i.e., about 1.3783) with respect to $\lambda_0$. The reflectivity of the laser light at the output face varies with a period of 0.5λ according to a sine curve with respect to the film thickness of the alumina film. Here, the thickness of the alumina film is fixed to λ/4, the width WM of the mesa waveguide is changed in the range of 1 μm to 5 μm, and the width WS of the slit is changed in the range of 1 μm to 5 μm. Calculation results are shown in FIG. 7.

Figure 7:
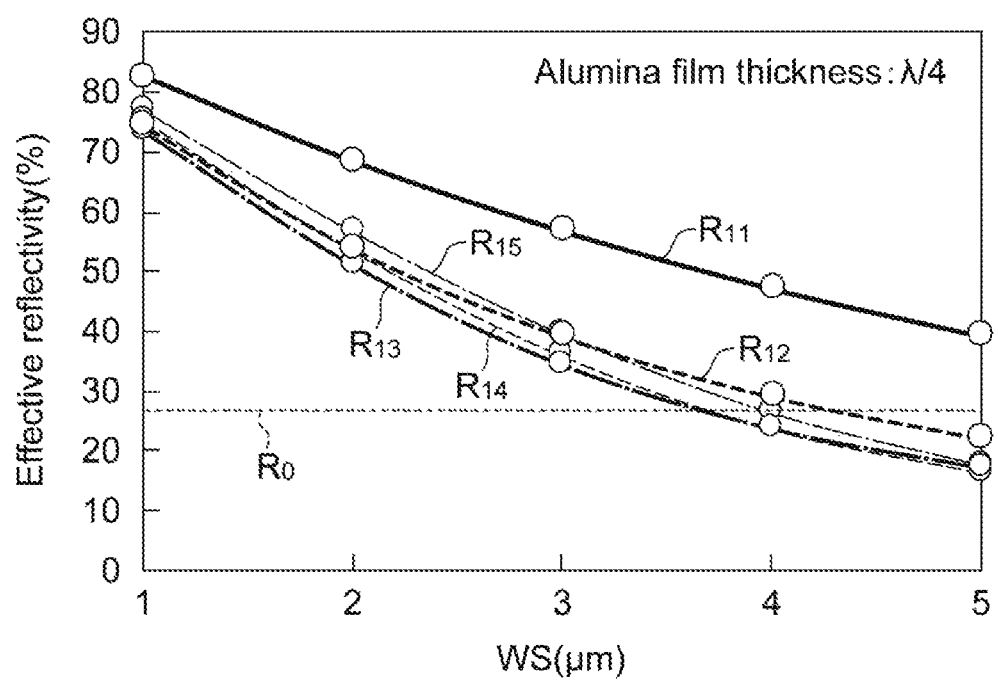
FIG. 7 is a graph showing an example of relationships between slit widths and effective reflectivity in an output face.

FIG. 7 is a graph showing an example of relationships between the width of the slit and effective reflectivity for the laser light at the output face. In FIG. 7, $R_0$ shows the calculated result of reflectivity for an uncoated output face. $R_{11}$ shows the results when the width WM of the mesa waveguide is 1 μm. $R_{12}$ shows the results when the width WM of the mesa waveguide is 2 μm. $R_{13}$ shows the results when the width WM of the mesa waveguide is 3 μm. $R_{14}$ shows the results when the width WM of the mesa waveguide is 4 μm. $R_{15}$ shows the results when the width WM of the mesa waveguide is 5 μm. As shown in FIG. 7, by adjusting the width WS of the slit, the effective reflectivity can be adjusted in the range of about 20% to 80%. In addition, the effective reflectivity is significantly larger when the width WM of the mesa waveguide is 1 μm compared to the effective reflectivity when the width WM of the mesa waveguide is 2 μm to 5 μm. When the width WM of the mesa waveguide is as small as 1 μm, it becomes difficult to confine light within the mesa waveguide. Consequently, the effective reflectivity is increased when the width WM of the mesa waveguide is 1 μm because the light diffused outward from the mesa waveguide is increased, and the light is totally reflected by the Au high-reflecting film.

As can be seen from FIG. 7, by adjusting the width WM of the mesa waveguide, the width WS of the slit, and the thickness of the alumina film, the effective reflectivity at the output face can be adjusted within the range of about 20% to 80%. Further, at a position of the slit, the Au high reflecting film is not formed on the output face and only the alumina film is formed. Thus, it is possible to avoid absorbing laser light by the Au high-reflecting film. As a result, a higher optical output power of laser light is obtained, e.g. 10 mW or more. In addition, by adjusting the width WM of the mesa waveguide, the width WS of the slit, and the thickness of the alumina film, it is possible to obtain a lower effective reflectivity even than the uncoated output face (denoted $R_0$ in FIG. 7).

Figure 8:
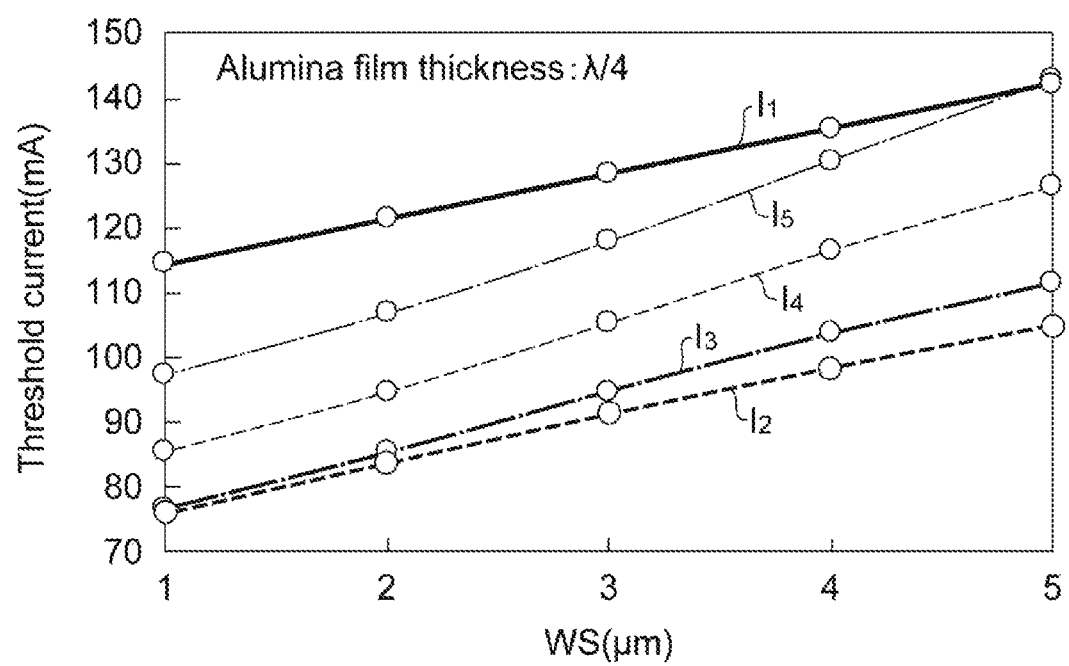
FIG. 8 is a graph showing an example of relationships between slit widths and threshold current.

FIG. 8 shows calculation results of threshold currents corresponding to the conditions in FIG. 7. FIG. 8 is a graph showing an example of relationships between the width of the slit and threshold currents. In FIG. 8, $I_1$ represents the threshold current when the width WM of the mesa waveguide is 1 μm. $I_2$ represents the threshold current when the width WM of the mesa waveguide is 2 μm. $I_3$ represents the threshold current when the width WM of the mesa waveguide is 3 μm. $I_4$ represents the threshold current when the width WM of the mesa waveguide is 4 μm. $I_5$ represents the threshold current when the width of the mesa waveguide is 5 μm. As indicated in FIG. 7 and FIG. 8, for each value of the width WM of the mesa waveguide, when the width WS of the slit decreases, the effective reflectivity increases and threshold current decreases. For the width WM of the mesa waveguide from 2 μm to 5 μm, the smaller the width WM is, the smaller threshold current becomes, for the same width WS of the slit. This is because as the width WM of the mesa waveguide becomes smaller, the width of the core layer into which the current is injected becomes smaller. However, for the width WM of 1 μm, the threshold current becomes the maximum although the effective reflectivity becomes the maximum. When the width WM of the mesa waveguide is as small as 1 μm, it is difficult to confine the light within the mesa waveguide, and therefore it is difficult to amplify the light by stimulated emission in the core layer. Consequently, threshold current is increased. Since the effect of increasing threshold current due to the difficulty of amplifying the light is larger than the effect of reducing threshold current due to the increase of the effective reflectivity, threshold current is increased.

Figure 9:
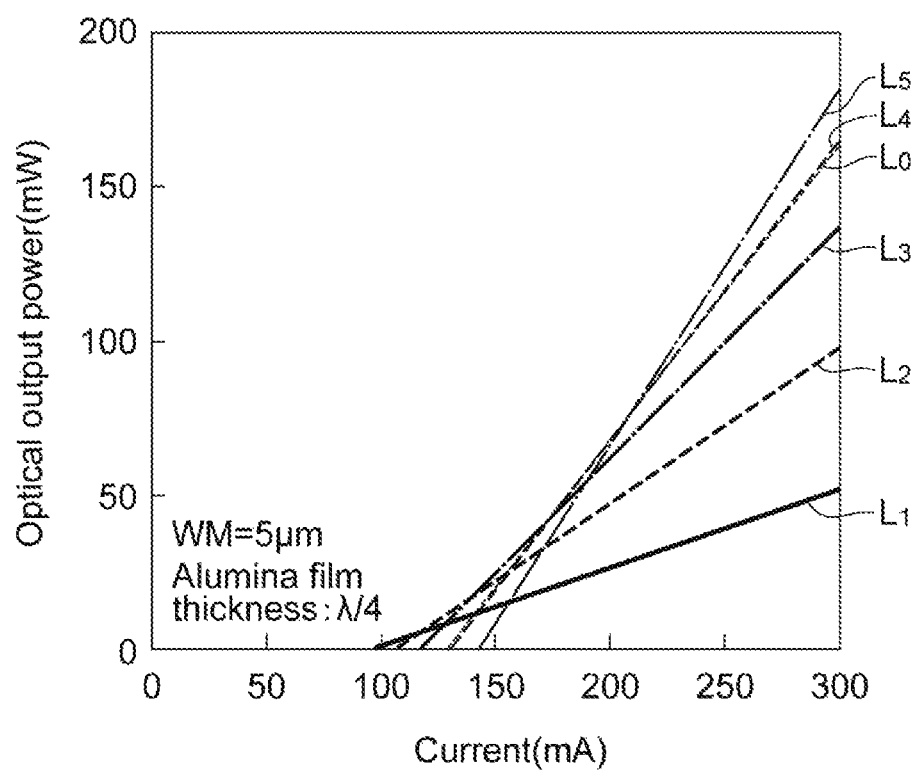
FIG. 9 is a graph showing an example of relationships between current and optical output power when slit width is changed.

FIG. 9 shows an example of the relationships between current and optical output power calculated for the width WM of the mesa waveguide fixed to 5 μm, the thickness of the alumina film fixed to λ/4, and the width WS of the slit varied from 1 μm to 5 μm. FIG. 9 is a graph showing an example of the relationships between the current and the optical output power when the width of the slit is changed. In FIG. 9, $L_0$ shows the calculation result of the optical output power when the output face is uncoated. $L_1$ shows the result when the width WS of the slit is 1 μm. $L_2$ shows the result when the width WS of the slit is 2 μm.

$L_3$ shows the result when the width WS of the slit is 3 μm. $L_4$ shows the result when the width WS of the slit is 4 μm. $L_5$ shows the result when the width WS of the slit is 5 μm. As indicated in FIG. 9, when the width WS of the slit becomes smaller, the threshold current can be reduced. This is because the effective reflectivity increases. However, when the width WS of the slit becomes smaller, the extraction of the emitted light from the slit becomes difficult. As a result the slope-efficiency of the emitted light, which corresponds to a slope of each line from $L_1$ to $L_5$ in FIG. 9, is reduced. Therefore, it is difficult to obtain a high output when the slit becomes narrower. On the other hand, when the width WS of the slit increases, the effective reflectivity at the output face decreases, and thus threshold current increases. However, when the width WS of the slit increases, the extraction of the emitted light from the slit is facilitated. Thus, the slope-efficiency of the emitted light is increased. Therefore, high output is easily obtained. In addition, when the width WS of the slit is 4 μm, substantially the same result as in the case where output face is not coated is obtained. This corresponds to the fact that, as shown in FIG. 7, when the width WS of the slit is 4 μm, the effective reflectivity is almost the same as that of the output face being uncoated.

Figure 10:
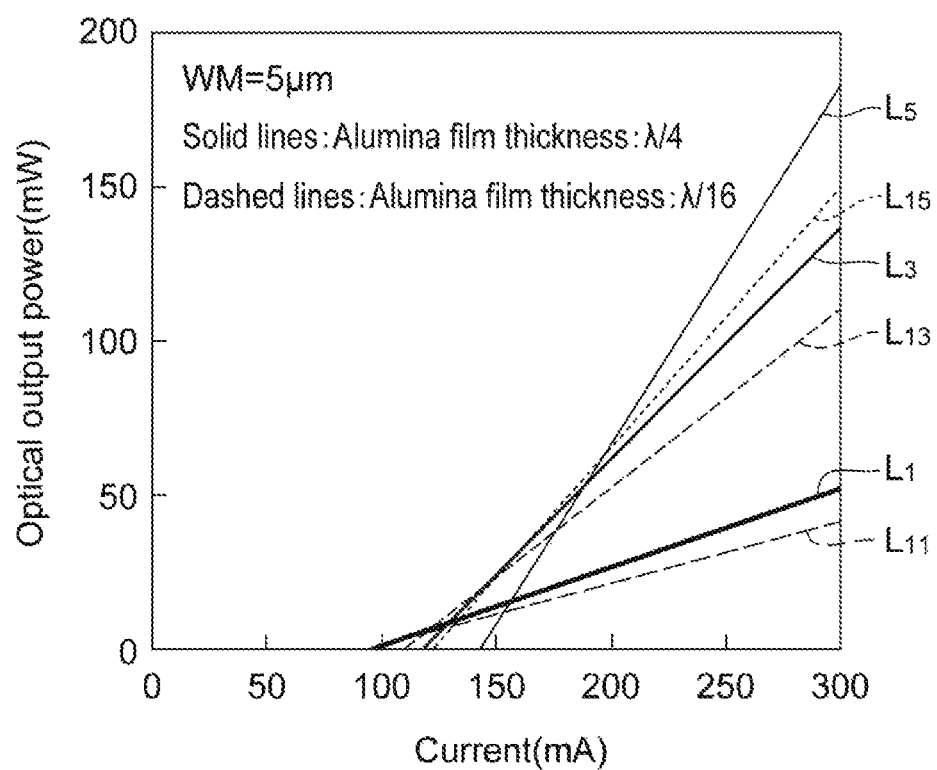
FIG. 10 is a graph showing an example of relationships between current and optical output power when slit width and thickness of alumina film are changed.

FIG. 10 shows an example of the relationships between current and optical output power calculated for the width WM of the mesa waveguide fixed to 5 μm, the thickness of the alumina film selected from λ/4 or λ/16, and the width WS of the slit varied from 1 μm to 5 μm. FIG. 10 is a graph showing an example of the relationships between the current and the optical output power when the width of the slit and the thickness of the alumina film are changed. In FIG. 10, $L_1$ shows the result when the alumina thickness is λ/4 and the width WS of the slit is 1 μm. $L_{11}$ shows the result when the width WS of the slit is 1 μm and the alumina thickness is λ/16. $L_3$ shows the result when the thickness of the alumina is λ/4 and the width WS of the slit is 3 μm. $L_{13}$ shows the result when the width WS of the slit is 3 μm and the alumina thickness is λ/16. $L_5$ shows the result when the thickness of the alumina is λ/4 and the width WS of the slit is 5 μm. $L_{15}$ shows the result when the width WS of the slit WS is 5 μm and the alumina thickness is λ/16. When the width WS of the slit are the same, the effective reflectivity is reduced as the thickness of the alumina film is greater. Thus, as shown in FIG. 10, high optical output power can be obtained as the alumina film thickness increases, while the threshold current increases. These dependences on the slit width are similar to those shown in FIG. 9.

Figure 12:
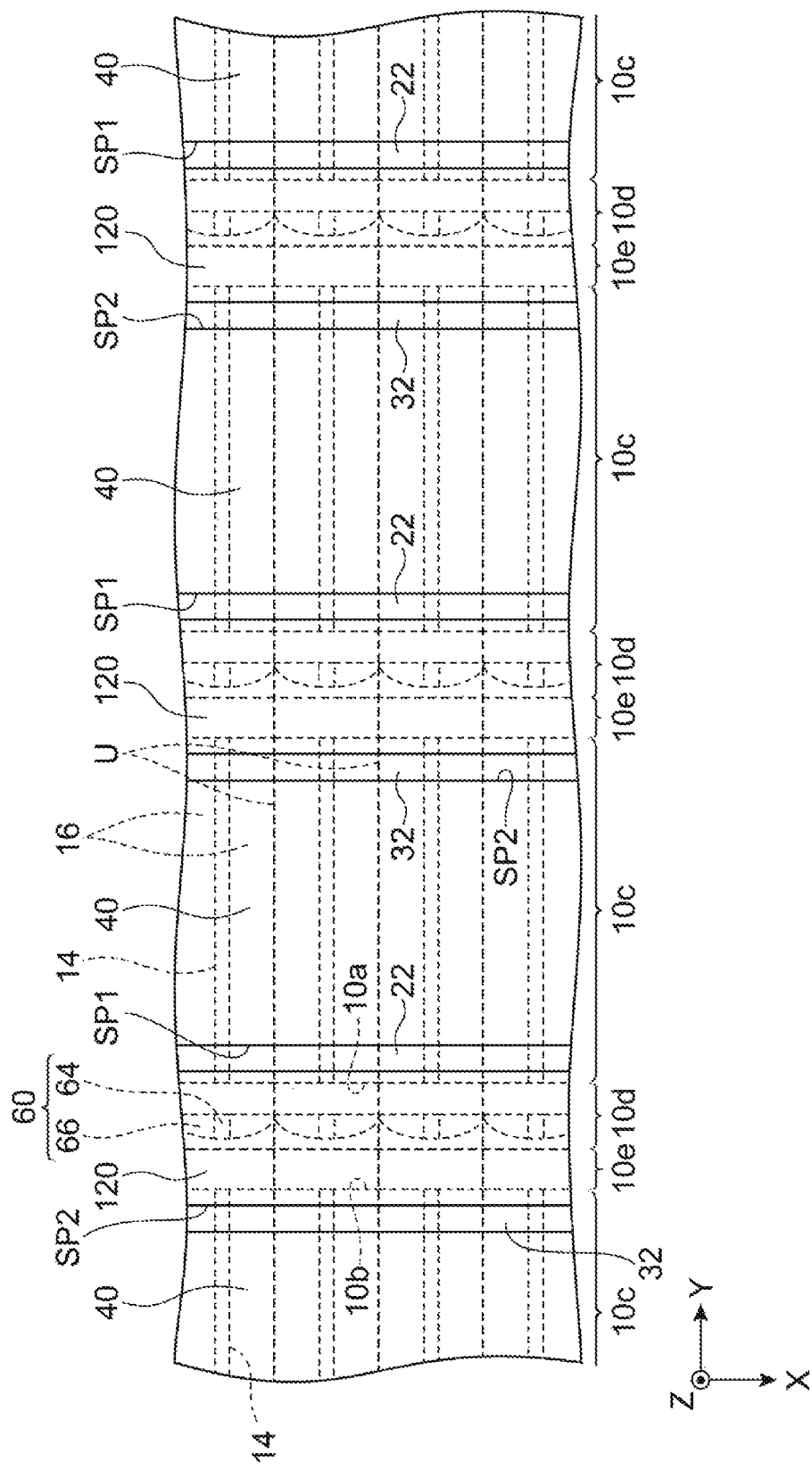
FIG. 12 is a top view showing the step in FIG. 11E.
Figure 13:
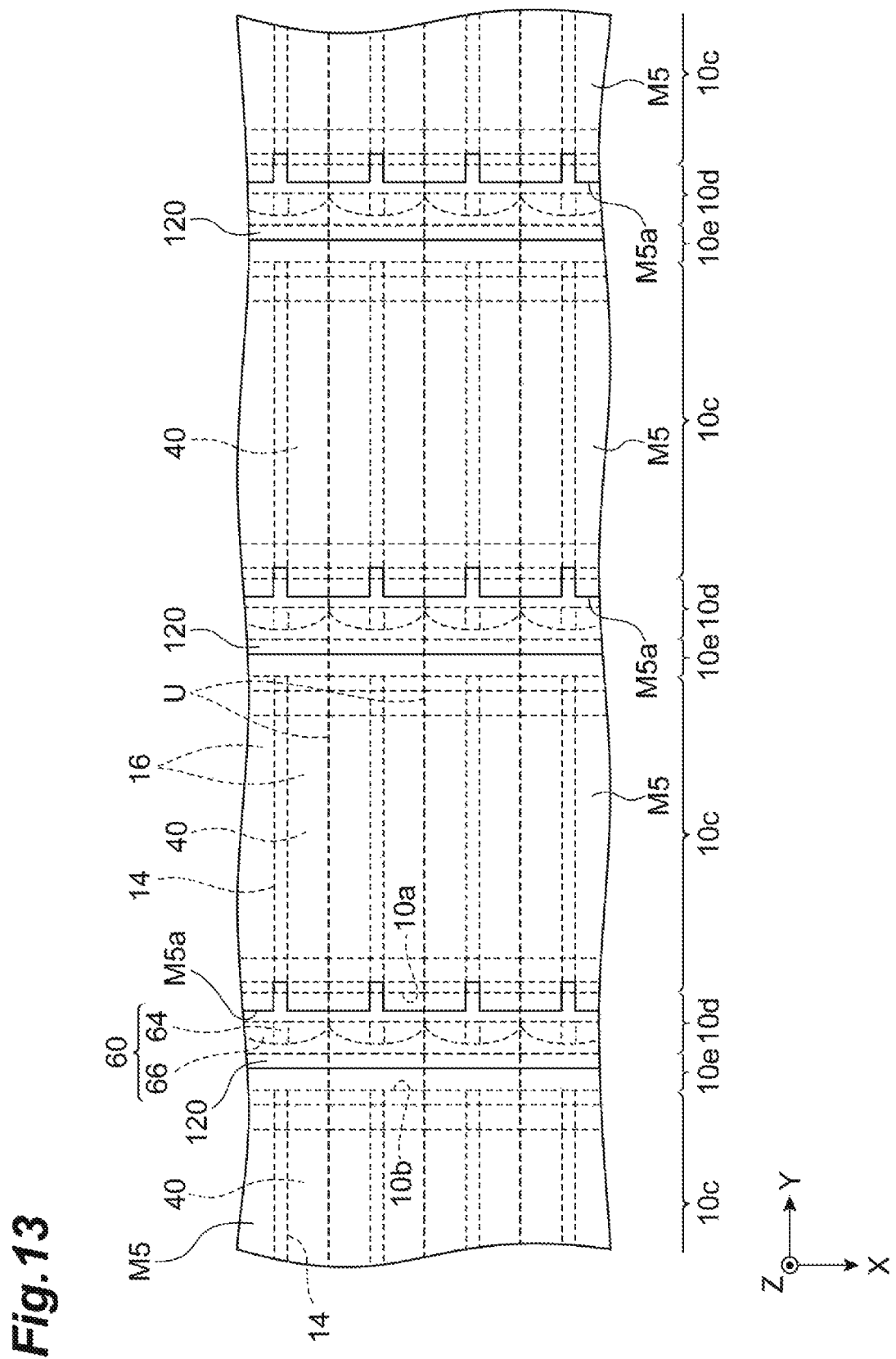
FIG. 13 is a top view showing a step of manufacturing a quantum cascade laser according to an embodiment.
Figure 14:
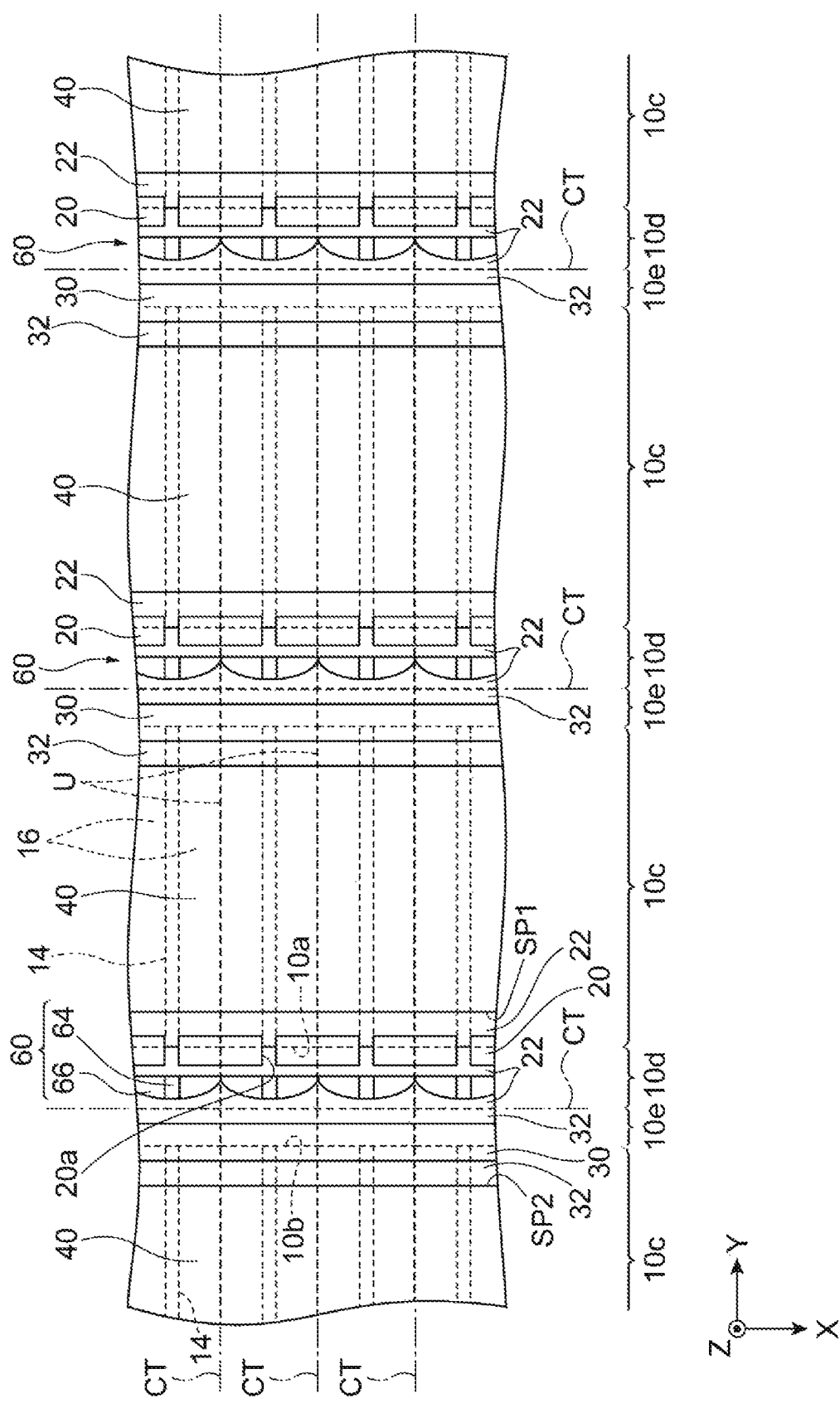
FIG. 14 is a top view showing a step of manufacturing a quantum cascade laser according to an embodiment.

Next, referring to FIG. 11A to FIG. 14, an example of a method of manufacturing the quantum cascade laser 1 according to the present embodiment will be described. FIG. 11A to FIG. 11E are diagrams showing the respective steps in the manufacturing process of the quantum cascade laser according to an embodiment. Each of FIG. 12 to FIG. 14 is a top view showing a step in the manufacturing process of the quantum cascade laser according to an embodiment. The quantum cascade laser 1 is produced as follows.

Figure 11A:
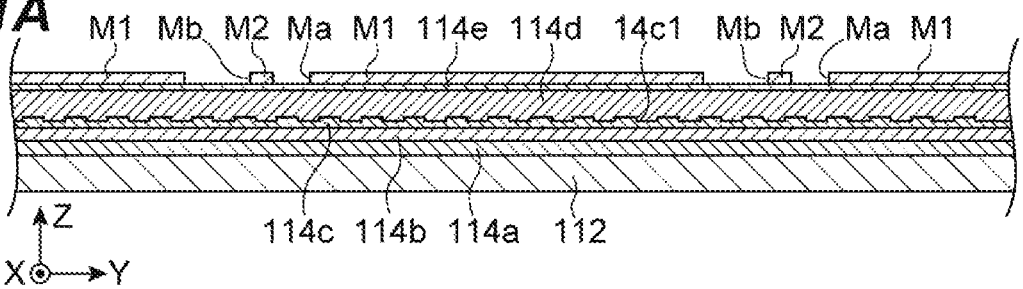
FIGS. 11A to 11E are diagrams schematically showing steps of manufacturing a quantum cascade laser according to an embodiment.

First, as shown in FIG. 11A, a mask M1 for forming the main body 10c of the laser structure 10 and a mask M2 for forming the lens 60 are formed on semiconductor layers 114a, 114b, 114c, 114d, and 114e which are sequentially provided on a semiconductor substrate 112. The semiconductor substrate 112 is processed to form the semiconductor substrate 12 of the quantum cascade laser 1 and the semiconductor pedestal 62, which are shown in FIG. 1 to FIG. 5. The semiconductor layers 114a, 114b, 114c, 114d, and 114e are processed to form the lower cladding layer 14a, the core layer 14b, the grating layer 14c, the upper cladding layer 14d, and the contact layer 14e, respectively. The semiconductor layers 114a, 114b, 114c, 114d, and 114e are formed by, for example, an organometallic vapor phase epitaxy (OMVPE) method or a molecular beam epitaxy (MBE) method. The recess 14c1 is formed in the semiconductor layer 114c serving as a grating layer 14c by photolithography and etching.

The semiconductor layers 114a, 114b, 114c, 114d, and 114e constitute a semiconductor mesa extending in the Y-axis direction. The semiconductor mesa becomes the mesa waveguide 14 and the semiconductor mesa 64. A plurality of semiconductor mesas are arranged in the X-axis direction. The plurality of semiconductor mesas are formed by photolithography and etching. Side surfaces of the semiconductor mesa are embedded by semiconductor embedding regions containing undoped or semi-insulating semiconductors. The semiconductor embedding regions become the current blocking region 16 and the semiconductor embedding region 66. The semiconductor embedding regions are formed by, for example, OMVPE method or MBE method.

The masks M1 and M2 are alternately arranged in the Y-axis direction. A slit Ma extending in the X-axis direction is formed between the mask M1 and one of the adjacent masks M2. A slit Mb extending in the X-axis direction is formed between the mask M1 and the other adjacent mask M2. An interval between the adjacent masks M1 corresponds to the total length in the Y-axis direction of the first protruding portion 10d and the second protruding portion 10e of the laser structure 10.

Figure 11B:
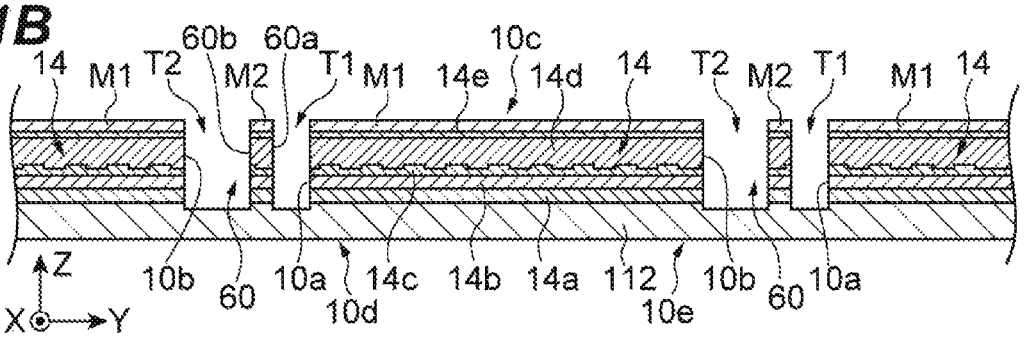

Next, as shown in FIG. 11B, a portion of the semiconductor substrate 112 and the semiconductor layers 114a, 114b, 114c, 114d, and 114e are dry-etched using the masks M1 and M2. As a result, trenches T1 and T2 are formed under the slits Ma and Mb, respectively. As a result, the mesa waveguide 14 and the current blocking region 16 are formed under the mask M1. The lens 60 is formed under the mask M2. That is, the main body 10c, the first protruding portion 10d, and the second protruding portion 10e of the laser structure 10 are formed. The output face 10a and the entrance surface 60a are exposed in the trench T1. The reflection face 10b and the convex surface 60b are exposed in the trench T2. The output face 10a and the reflection face 10b are orthogonal to the Y-axis direction, so that the output face 10a and the reflection face 10b form a resonator. The entrance surface 60a is also perpendicular to the Y-axis direction, so that laser light L is incident to the entrance surface 60a. The convex surface 60b is perpendicular to the X-Y plane, as the convex surface 60b constitutes a lens surface. To make the surfaces perpendicular to Y-axis and X-Y plane, reactive ion etching (RIE) having excellent vertical etching properties is adopted for the dry-etching.

Figure 11C:
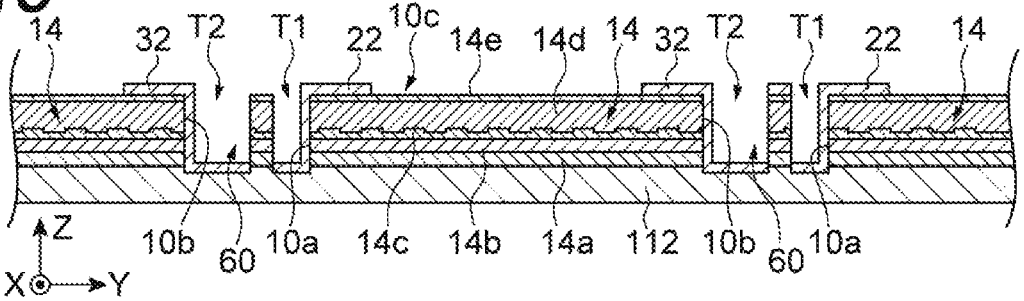

Next, after removing the masks M1 and M2, as shown in FIG. 11C, the passivation film 22 covering the output face 10a and the passivation film 32 covering the reflection face 10b are formed by CVD method, photolithography and dry etching. The passivation film 22 also covers bottom surfaces of the trenches T1 and a portion of a top surface of the main body 10c of the laser structure 10. The passivation film 32 also covers bottom surfaces of the trenches T2 and a portion of the top surface of the main body 10c of the laser structure 10.

Figure 11D:
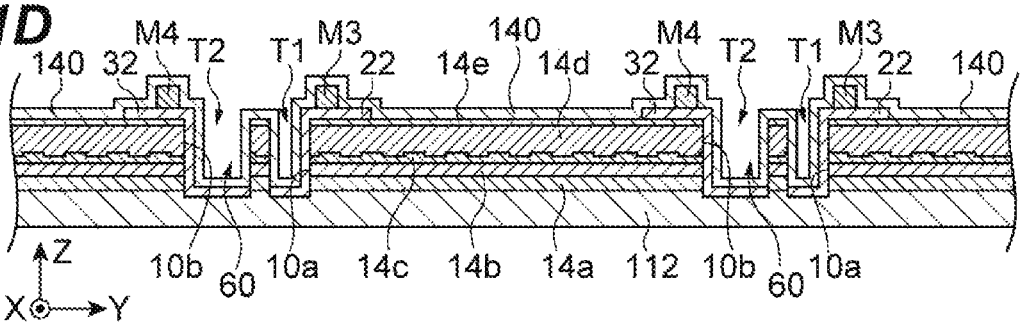

Next, as shown in FIG. 11D, a resist mask M3 for forming the space SP1 between the first end of the reflecting film 20 and the upper electrode 40 and a resist mask M4 for forming the space SP2 between the first end of the reflecting film 30 and the upper electrode 40 are formed on the passivation film 22 and passivation film 32, respectively. Subsequently, a metal film 140 is formed on the resist mask M3 and the resist mask M4, for example, by vapor deposition or sputtering. The metal film 140 is formed over the entire surface of the semiconductor substrate 112.

Figure 11E:
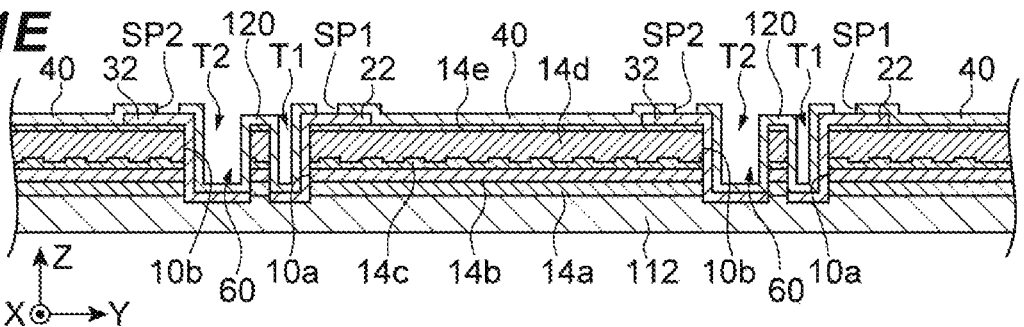

Next, as shown in FIG. 11E and FIG. 12, the resist masks M3 and M4 are stripped by lift-off to form the voids SP1 and SP2, respectively. Consequently, the upper electrode 40 is formed on the main body 10c of the laser structure 10. On the other hand, a metal film 120 is formed on the first protruding portion 10d and the second protruding portion 10e of the laser structure 10. The metal film 120 covers the trenches T1 and T2 and the lens 60. As shown in FIG. 12, the unit structures U each including the main body 10c, the first protruding portion 10d and the second protruding portion 10e of the laser structure 10 are arrayed in the X-axis direction and Y-axis direction.

Next, as shown in FIG. 13, a resist mask M5 having an opening M5a for forming the reflecting film 20 and the reflecting film 30 is formed on the metal film 120 by photolithography and etching. The opening M5a is located on the lens 60.

Next, as shown in FIG. 14, the metal film 120 is etched. Examples of etching are dry etching such as RIE or ion milling, and wet etching using a mixture of iodine and potassium iodide. Thereafter, the resist mask M5 is removed. Thus, the reflecting film 20 and reflecting film 30 are formed from the metal film 120.

Thereafter, by polishing the back surface of the semiconductor substrate 112, the thickness of the semiconductor substrate 112 is reduced to, for example, 100 μm to 200 μm. Next, the lower electrode 50 is formed on the back surface of the semiconductor substrate 112 by, for example, vapor deposition.

Next, the semiconductor substrate 112 and the lower electrode 50 are divided into a plurality of unit-structures U by cutting. The cutting is done along a lattice-like cutting lines CT. The lattice-like cutting lines CT are boundaries between the passivation film 22 and the passivation film 32. Thereby a quantum cascade laser 1 corresponding to the unit structure U is obtained. Examples of the cutting are cleavage, dicing, etc.

While preferred embodiments of the present disclosure have been described in detail above, the present disclosure is not limited to the above embodiments.

For example, the lens 60 may be a bi-convex lens. In this case, the incident surface 60a when viewed from the Z-axis direction is also curved convexly.

While the principles of the present invention have been illustrated and described in preferred embodiments, it will be appreciated by those skilled in the art that the invention may be modified in arrangement and detail without departing from such principles. The present invention is not limited to the specific configurations disclosed in this embodiment. Accordingly, it is claimed that all modifications and changes come from the scope of the claims and their spirit.

What is claimed is:

1. An quantum cascade laser comprising:
    a laser structure having an output face for emitting laser light in a first direction;
    a lens having an entrance surface and a convex surface, the entrance surface receiving the laser light from the output face, the convex surface emitting the laser light condensed by the lens; and
    a reflecting film provided on the output face,
    wherein
    the laser structure includes a semiconductor substrate and a mesa waveguide provided on a first region of a principal surface of the semiconductor substrate, the mesa waveguide extending in the first direction,
    the lens includes a semiconductor and is provided on a second region of the principal surface of the semiconductor substrate,
    the first region and the second region are arranged in the first direction, and
    the reflecting film has a slit transmitting the laser light.

2. The quantum cascade laser according to claim 1, wherein
    the lens is a plano-convex lens, and
    the convex surface is convexly curved when viewed from a second direction intersecting the principal surface of the semiconductor substrate.

3. The quantum cascade laser according to claim 1, wherein a width of the slit is 1 μm to 5 μm.

4. The quantum cascade laser according to claim 1, wherein
    the laser structure includes a current blocking region embedding a side surface of the mesa waveguide,
    the current blocking region includes an undoped or semi-insulating semiconductor,
    the lens includes a semiconductor mesa extending in the first direction and a semiconductor embedding region embedding a side surface of the semiconductor mesa, and
    the semiconductor embedding region includes an undoped or semi-insulating semiconductor.

5. The quantum cascade laser according to claim 1, wherein a width of the mesa waveguide is 2 μm to 5 μm.

6. The quantum cascade laser according to claim 1, wherein a space is provided between the entrance surface and the output face.

7. The quantum cascade laser according to claim 6, wherein a distance between the entrance surface and the output face is 5 μm or more.

8. A quantum cascade laser comprising:
    a laser structure having an output face for emitting laser light in a first direction; and
    a lens having an entrance surface and a convex surface, the entrance surface receiving the laser light from the output face, the convex surface emitting the laser light condensed by the lens,
    wherein
    the laser structure includes a semiconductor substrate and a mesa waveguide provided on a first region of a principal surface of the semiconductor substrate, the mesa waveguide extending in the first direction,
    the lens includes a semiconductor and is provided on a second region of the principal surface of the semiconductor substrate,
    the first region and the second region are arranged in the first direction,
    the laser structure includes a current blocking region embedding a side surface of the mesa waveguide,
    the current blocking region includes an undoped or semi-insulating semiconductor,
    the lens includes a semiconductor mesa extending in the first direction and a semiconductor embedding region embedding a side surface of the semiconductor mesa, and
    the semiconductor embedding region includes an undoped or semi-insulating semiconductor.

* * * * *